United States Patent

[11] 3,615,941

[72] Inventors Eiichi Yamada;
Masayuki Yamamoto, both of Kodaira-shi, Japan

[21] Appl. No 820,433
[22] Filed Apr. 30, 1969
[45] Patented Oct. 26, 1971
[73] Assignee Hatachi, Ltd.
Tokyo, Japan
[32] Priorities May 7, 1968
[33] Japan
[31] 43/30465;
May 7, 1968, Japan, No. 43/30466

[54] METHOD FOR MANUFACTURING SEMICONDUCTOR DEVICE WITH PASSIVATION FILM

12 Claims, 16 Drawing Figs.

[52] U.S. Cl. .................................... 148/187, 29/576, 29/578, 117/201, 148/1.5, 148/188, 317/235 AG
[51] Int. Cl. .................................... H01l 7/34
[50] Field of Search .................................... 148/188, 187; 29/576, 588; 117/201; 317/235 AG

[56] References Cited

UNITED STATES PATENTS

| | | | |
|---|---|---|---|
| 3,334,281 | 8/1967 | Ditrick .................... | 148/187 |
| 3,430,335 | 3/1969 | Gee .................... | 29/588 |
| 3,457,125 | 7/1969 | Kerr .................... | 148/188 |
| 3,490,963 | 1/1970 | Sprague .................... | 148/187 |
| 3,507,716 | 9/1967 | Nishida et al. .................... | 148/187 |

*Primary Examiner*—L. Dewayne Rutledge
*Assistant Examiner*—R. A. Lester
*Attorney*—Craig, Antonelli, Stewart & Hill

ABSTRACT: A method for manufacturing a semiconductor device whose surface is passivated by a silicon oxide film, forming a pyrolytic silicon oxide film on the surface of a semiconductor substrate at a temperature no higher than 900° C., depositing phosphorus oxide from a vapor phase containing phosphorus at a temperature no higher than 900°C. on the surface of said silicon oxide film, and causing a reaction between the surface layer of silicon oxide and phosphorus oxide at a temperature no higher than 900°c., thereby forming in the surface of said deposited film a glass layer mixed with phosphorus oxide and silicon oxide.

Figure 1:
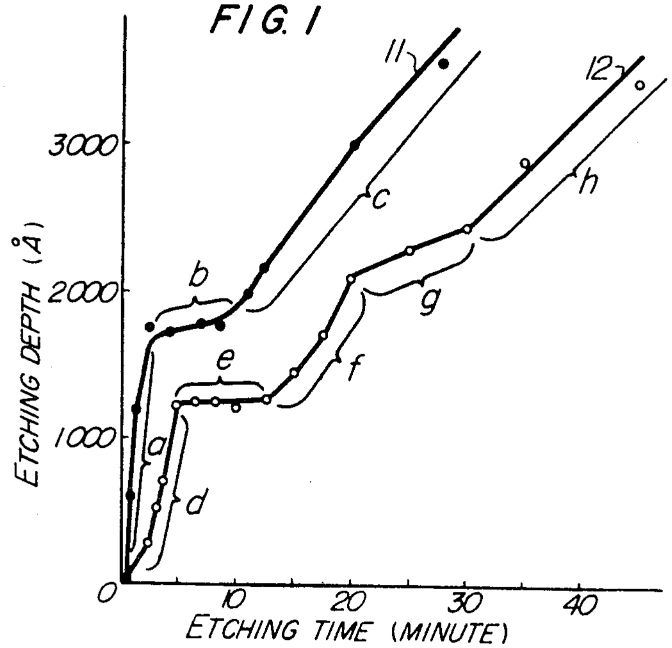

INVENTORS
EIICHI YAMADA and MASAYUKI YAMAMOTO
BY
Craig, Antonelli, Stewart & Hill ATTORNEYS

INVENTORS

EIICHI YAMADA and MASAYUKI YAMAMOTO

BY

Craig, Antonelli, Stewart & Hill ATTORNEYS

INVENTORS
EIICHI YAMADA and MASAYUKI YAMAMOTO
BY
Craig, Antonelli, Stewart & Hill ATTORNEYS

INVENTORS

EIICHI YAMADA and MASAYUKI YAMAMOTO

BY

Craig, Antonelli, Stewart & Hill ATTORNEYS

METHOD FOR MANUFACTURING SEMICONDUCTOR DEVICE WITH PASSIVATION FILM

This invention relates to a method for manufacturing a semiconductor device with a passivation film, and more particularly to a method for obtaining a semiconductor device having excellent electrical characteristics and high reliability at a relatively low temperature.

When a semiconductor device is manufactured by introducing an impurity determining the conductivity-type into the semiconductor substrate, it is usual that the device has a PN-junction exposed on the surface of substrate. The PN junction is contaminated by water, ionic substances, and other various attachments so that it is difficult to maintain the electrical characteristics of the device such as the reverse breakdown voltage and noise characteristics in proper states.

The planar technique is an effective method which has been developed to solve this problem. According to this method, since all the PN junctions exposed on the surface of semiconductor substrate are covered with a silicon dioxide film ($SiO_2$) obtained by the thermal growth, the influence of the external atmosphere can be eliminated.

However, generally the silicon dioxide film is formed by oxidizing the silicon semiconductor substrate at a high temperature above about 1,000° C. and used for the selective diffusion of the impurity determining the conductivity type, which is practiced at a high temperature near 1,000° C. Therefore, unwanted layers with crystal defects are ready to be formed in the interface between the film and the semiconductor substrate due to the difference of thermal expansion coefficient between the two. The recombination of current carriers is thus promoted in the surface layer of the substrate, giving rise to a decrease in current amplification factor and a deterioration of noise characteristic.

Further, the silicon oxide film thermally grown on the surface of the silicon substrate has a property of facilitating the generation of donor levels in the surface of said substrate, which is well-known as the N-channel phenomenon. This property also deteriorates the electrical characteristics (e.g. reverse voltage-current characteristic of the diffused PN junction and the stability of operation of the semiconductor element formed in the substrate.

The unstableness caused by the channel phenomenon is considered to be due to the invasion of unavoidable metal ions mainly sodium ions ($Na^+$) into the silicon dioxide film and/or the existence of positive ions owing to the oxygen vacancy in the silicon dioxide film.

As a measure of preventing these bad influences of the channel induced by the positive ions in the silicon oxide film it has been proposed to deposit phosphorus oxide, presumed to be phosphorus pentoxide ($P_2O_5$), on the thermally grown $SiO_2$ film and heat it to form a phosphosilicate glass film. In this method it is recommended to cause a reaction between the surface layer of $SiO_2$ film and $P_2O_5$ by high temperature treatment near 1,000° C. and convert them to a perfect phosphosilicate glass layer.

However, such high-temperature treatment deteriorates the various electrical characteristics of the semiconductor element rather than promotes them as is the case with the planar technique. Then the simultaneous improvement of the stability and the electrical characteristics is an antimony.

Therefore one object of this invention is to provide a method for manufacturing a semiconductor device having excellent electrical characteristics and high stability.

Another object of this invention is to provide a method for manufacturing easily a semiconductor device having a passivation film and high reliability without any high-temperature treatment.

Still another object of this invention is to provide a method for covering the surface of a semiconductor substrate, in which a semiconductor element is formed, at a low temperature such that the electrical characteristics of the element may not be damaged.

According to one embodiment of this invention attaining these objects, when a film of $SiO_2$ etc. is used, the film is first removed from the surface of a semiconductor substrate in the diffusion process prior to forming a surface passivation film. Preferably, the exposed surface of the semiconductor substrate is lightly etched. A new $SiO_2$ film is formed on the semiconductor substrate at a low temperature no higher than about 900° C., or more suitably no higher than 850° C. Thereafter, a glass film containing phosphorus oxide is formed on the $SiO_2$ film. As soon as phosphorus oxide is deposited on the $SiO_2$ a temperature no higher than 900° C., or after a further heat treatment at or below 900° C., is carried out for a suitable period, the formation of a glass film containing phosphorus oxide and silicon oxide having a thickness no more than 400 A. and rich in phosphorus oxide is possible.

These and other objects and features of this invention will be made more apparent from the following explanation of the preferred embodiments of this invention with reference to the accompanying drawings, in which;

FIG. 1 shows the etching characteristic of a passivation film or a sample for the experiment.

Figures 2A, 2B, 2C, 2D, 2E, 2F, 2G, 3, 4A, 4B, 4C:
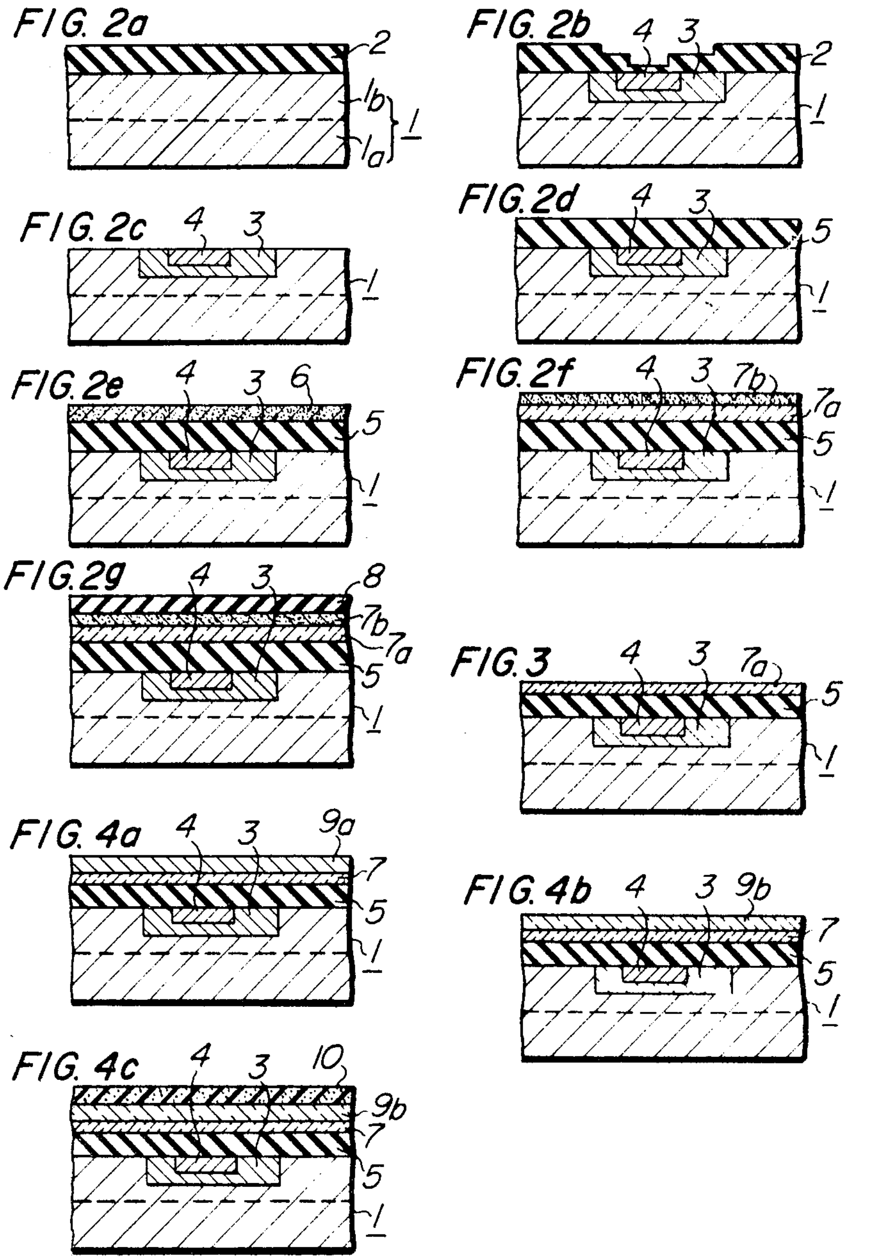

FIGS. 2*a* and 2*g* show cross-sectional views of a semiconductor substrate in respective manufacturing steps of a transistor according to one embodiment of this invention.

FIG. 3 shows a cross-sectional view of a semiconductor substrate according to a modified embodiment of this invention.

FIGS. 4*a* to 4*c* show cross-sectional views of a semiconductor substrate according to a further embodiment of this invention.

Figure 6:
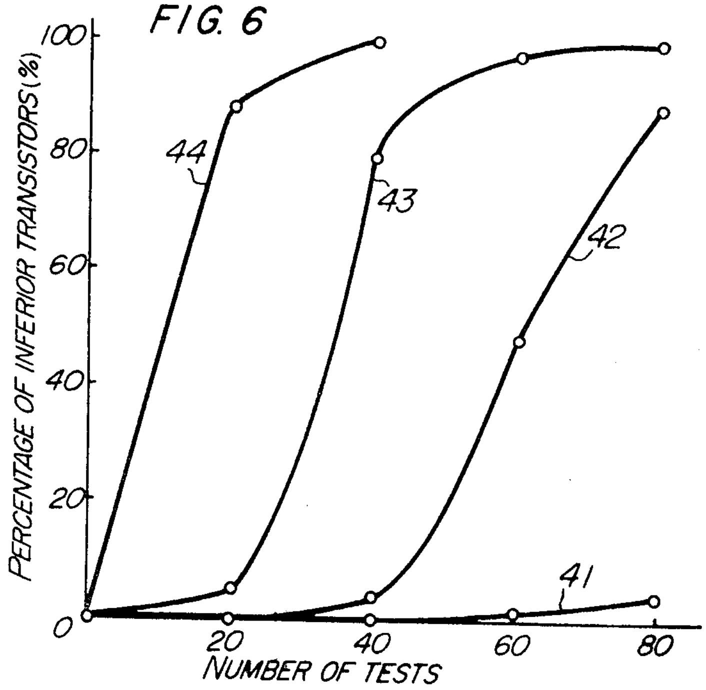
Figure 5:
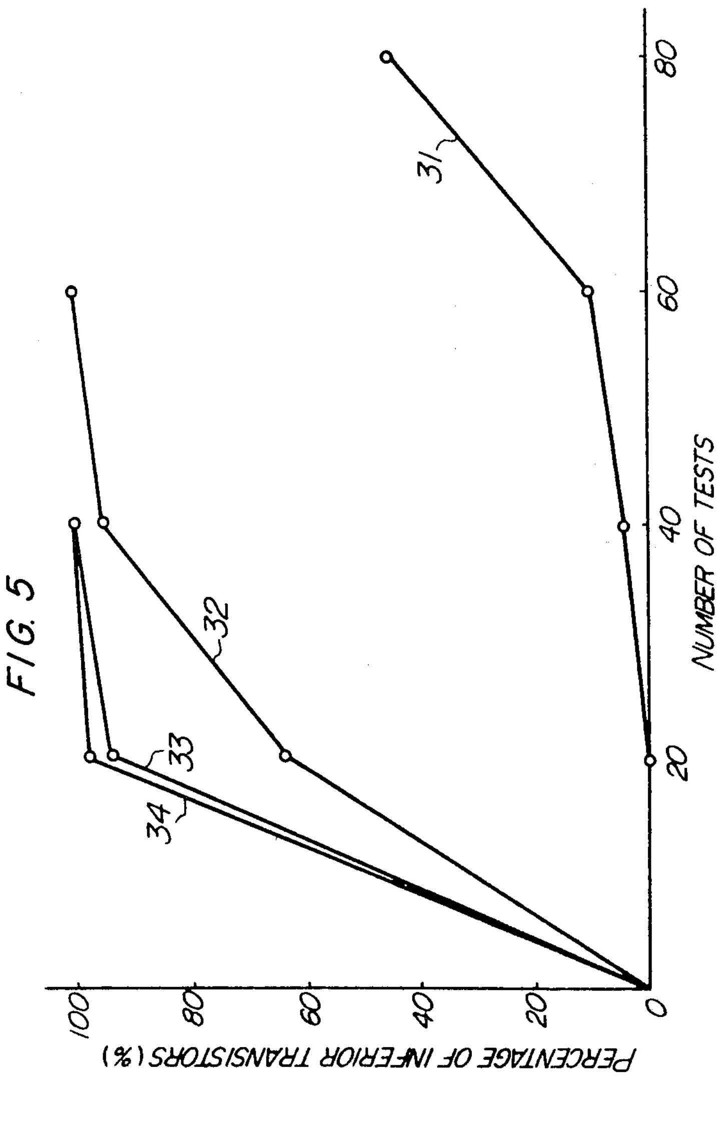

FIGS. 5 and 6 show the test results of a semiconductor device obtained in the above embodiment.

Figure 7:
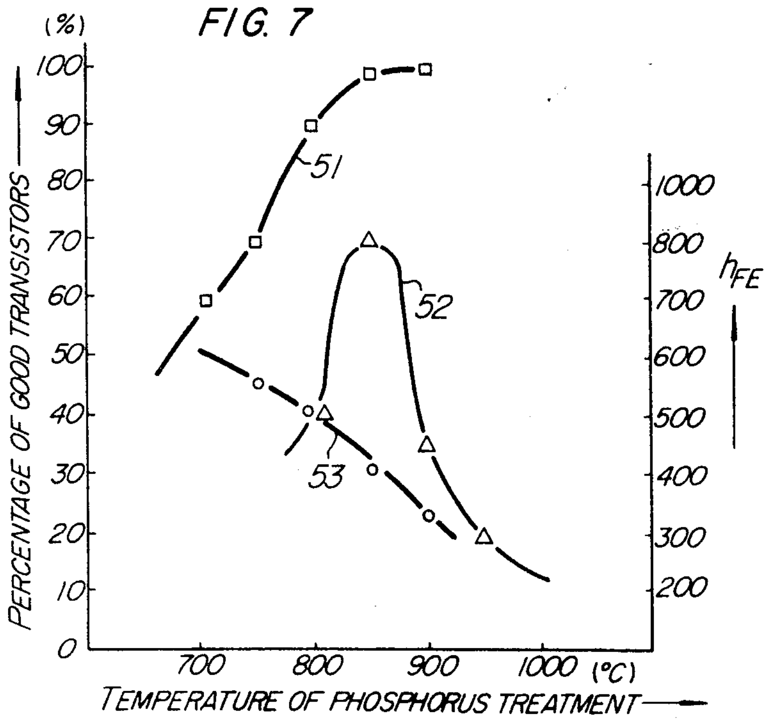
Figure 8:
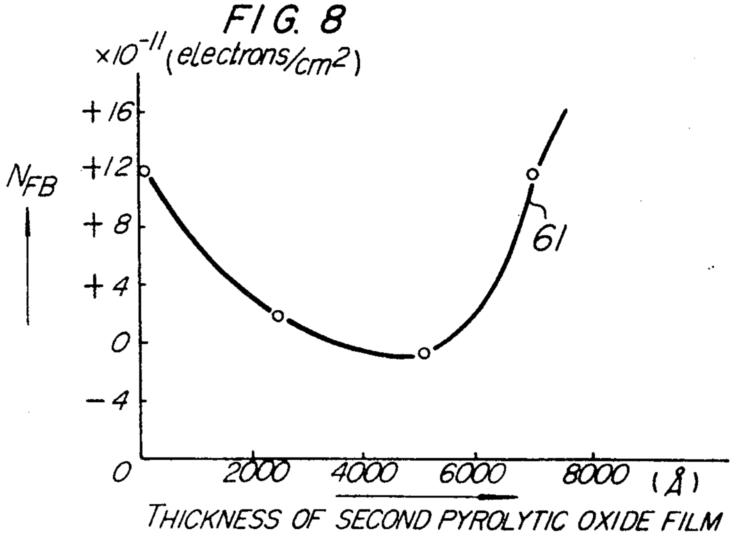

FIG. 7 shows the current amplification factor $h_{FE}$ in a common emitter circuit and the good quality ratio found in the noise and waterproof tests of the transistors obtained by this invention for different temperatures of phosphorus treatment; and FIG. 8 shows the relation between the equivalent electron concentration $N_{FB}$ corresponding to the flat-band voltage and the thickness of the second pyrolytic silicon oxide film.

The inventors have investigated the technique of forming a silicon oxide film on a pure surface of semiconductor substrate (obtained after removing the thermally grown silicon oxide film laid thereover) at a sufficiently low temperature so as not to cause any adverse influence on the electrical characteristics of the PN-junction in the substrate, and of forming a glass film containing phosphorus oxide on the silicon oxide film thus formed also at such a low temperature as described above.

As far as the inventors know, it is generally believed by those skilled in the art that unless the fine surface layer of thermally grown silicon oxide film is completely converted to phosphorus glass the industrial production of a semiconductor device having a sufficiently stable passivation film is impossible.

Against such an expectation the inventors' efforts based on the above-mentioned investigations have succeeded in developing a semiconductor device having excellent electrical characteristics, e.g. reverse current-voltage characteristic and noise characteristic, and sufficiently high reliability to withstand satisfactorily the environment tests for ordinary use.

According to the results of study, the difficulty in the formation of a mixed layer of phosphorus oxide and silicon oxide at a low temperature, which promises the high reliability of the semiconductor element, is considered to be due to the facts that the silicon oxide layer formed by the pyrolytic decomposition method is rather porous, that phosphorus oxide deposited on the silicon oxide film does not make a satisfactory vitrifaction reaction with the silicon oxide film on the surface layer thereof, and that hygroscopic phosphorus oxide is richer than silicon oxide in the surface layer of the glass layer.

A sample having thereon a sufficiently thick glass film containing phosphorus oxide which is formed at a relatively low temperature e.g., 850° C.) was dipped in 0.2 percent hydrofluoric acid solution and the etching speed was measured by using an interference microscope. The result is as shown in FIG. 1.

In the curve 11 of FIG. 1, the part *c* corresponds to a layer of silicon oxide and the parts *b* and *a* correspond to a glass layer containing phosphorus oxide. The part *a* has an extremely large etching speed while the part *b* a small one. In the part *a* (thickness of about 1,500 A.) the mixing or the vitrifaction reaction between phosphorus oxide and silicon oxide is unsatisfactory and a region extremely rich in phosphorus oxide is assumed to be formed. The part *b* has a thickness of about 200 A. The exact composition of the layer corresponding to the part *b* is unclear but the layer is thought to be useful for the stabilization of electrical characteristics, and to include phosphorus oxide and silicon oxide.

Therefore, this invention is aimed at a method for forming a glass layer containing phosphorus oxide and silicon oxide on the surface of the silicon oxide film which covers the surface of semiconductor element without sacrificing the reliability of the element at a sufficiently low temperature so as not to cause a large variation in the electrical characteristics. In the above method the inventors have found the existence of a layer harmful to the reliability appearing on the surface of the glass layer. The object of this invention is attained by preventing the formation of such a layer, removing such a layer if formed, or restricting the thickness of the layer within certain limits.

Detailed explanation of this invention will be made hereinafter with reference to FIGS. 2*a* to 2*g*.

a. First an N-type silicon substrate 1 having a resistivity of 0.01 to 0.02 Ωcm. and a thickness of 200 μ is prepared. On the major surface of the base **1*a* an N-type silicon layer 1*b* having resistivity of 2.5 to 4 Ωcm. and a thickness of 10 to 15 μ is formed by the well-known epitaxial technique. The substrate 1 is heated for 2 hours at 1,100° C. in an oxidizing atmosphere containing water vapor thereby to form a silicon oxide film 2 of 5,000 to 6,000 A. thickness on the epitaxial layer 1*b*** as shown in FIG. 2*a*.

b. A portion of the above silicon oxide film 2 is removed. Boron and phosphorus are selectively diffused in the semiconductor substrate 1 thereby to form a P-type base region 3 and an N-type emitter region 4 having thicknesses of 3 μ and 2 μ respectively as shown in FIG. 2*b*. Usually the diffusion treatment requires heating above about 1,000° C. for about an hour. The silicon oxide film 2, in particular the portion newly formed on the diffused region, has a large amount of diffusion impurity.

c. As shown in FIG. 2*c*, the silicon oxide film 2 is entirely removed by hydrofluoric acid solution (HF.) Further, the surface of semiconductor substrate 1 is etched for example no more than 1 μ, preferably 0.5 μ in depth by mixed solution of nitric acid and hydrofluoric acid ($HNO_3$—HF.) Thereafter, the substrate is sufficiently cleaned by alcohol and pure water etc. and dried.

d. The semiconductor substrate 1 is heated for 20 minutes at 740° C. in a tetraethoxy silane ($Si(OC_2H_5)_4$) atmosphere of $1\times10^{11}$ mm.hg., thereby forming a first pyrolytic silicon oxide film 5 of about 5,000 A. thickness by the thermal decomposition of the above silane, as shown in FIG. 2*d*. The film has preferably a thickness of about 3,000 A.

e. Next the semiconductor substrate 1 is heated for 20 minutes at 820° C. in an atmosphere containing phosphorus oxychloride ($POCl_3$) and oxygen ($O_2$) thereby forming a phosphorus oxide layer 6 on the silicon oxide film 5 as shown in FIG. 2*e*.

f. Successively phosphorus pentoxide is diffused in the silicon oxide film 5, and a glass film **7*a*** containing phosphorus oxide and silicon oxide is formed as shown in FIG. 2*f*, the glass film **7*a* having thereon a surface layer 7*b*** (corresponding to the part *a* in FIG. 1) rich in phosphorus oxide with a thickness of about 200 A. although the exact components are not clear.

g. Desirably tetraethoxy silane is pyrolytically decomposed on the glass film under the conditions of 740° C. and 3 minutes thereby to form a second pyrolytic silicon oxide film 8 as shown in FIG. 2*g*. The second silicon oxide film 8 serves in later steps to facilitate the attachment of photoresist material, and isolate the hygroscopic phosphorus oxide layer **7*b* from the external atmosphere. Particularly, if the second pyrolytic silicon oxide film 8** is formed to have a special thickness, the film can suppress the formation of a channel, as will be mentioned later.

Finally, aluminum electrodes are fitted to the base 3 and the emitter 4 by well-known methods. External leadout leads are connected to these electrodes 8 and the semiconductor substrate 1 or the collector. The substrate and the tip of the lead connected thereto are embedded by epoxyresin and a so-called resin mold transistor is fabricated.

The transistor thus fabricated was subjected to a waterproof test. The transistor was dipped for 25 minutes in boiling water (125° C.) under a pressure of 17 p.s.i. (pressure/square inch) and next dipped in water of 0° C. for 1 minute. The heating and cooling treatments were repeated.

The above test was practiced with 100 transistors having good reverse breakdown characteristics. When the current-voltage characteristic curve of a PN junction between the base and the collector was deteriorated by the above test, the transistor was judged to be inferior. The result of the test is shown in FIG. 5 by the curve 31.

In FIG. 5, the abscissa is the number of heating and cooling tests while the ordinates is the percentage of inferior transistors by the above test. The curves 32, 33 and 34 show the results of the same tests applied to 100 good transistors which have glass layers **7*b* rich in phosphorus oxide of 400 A., 600 A. and 1,000 A. thickness respectively on the mixed layers 7*a*** in the step (f) by 40 minutes heating after the steps (a) to (d). In the above embodiment, the thickness of the insulating film was measured with an interference microscope so that each measured value was thought to have an error of the order of ± 100 A.

As evident from the above results, the characteristics of the transistors against the environment test depends on the glass layer containing phosphorus oxide formed on the silicon oxide film, particularly on the thickness of the region in phosphorus oxide. When the thickness of this region is no more than 400 A., particularly no more than 200 A., the transistor has an excellent waterproof property.

One of the important points of this invention is the temperature of phosphorus treatment process in FIG. 2*f*. The curve 53 in FIG. 7 shows the current amplification factor $h_{FE}$ (measured under the collector voltage 12 v. and the collector current 2 ma.) of the transistor thus obtained vs. the temperature of phosphorus treatment. It is seen that $h_{FE}$ is decreased by the high-temperature treatment. The curve 51 shows the relation between the percentage of good transistors (When $h_{FE}$ is varied less than ± 20 percent after the test, the transistor was judged to be good.) and the temperature of phosphorus treatment. These curves 51 and 53 show that the high-temperature phosphorus treatment yields reliable transistors but deteriorates the electrical characteristics (e.g. decay of $h_{FE}$.) The noise figure (NF) which is an important factor in the electrical characteristics of transistors exhibits the maximum good quality ratio at about 850° C. as shown by the curve 52. The transistors having an NF less than 5 percent under the measuring conditions of collector voltage 12 v., collector current 0.1 ma., signal source resistance 500 Ω and frequency 10 $H_z$ were judged to be good. According to the invention, in view of the curves 51, 52 and 53 and the industrial production of the semiconductor devices such as transistors, the temperature of phosphorus treatment should be practiced no higher than about 900° C., more desirably no higher than about 850° C. So, it is desirable in the manufacturing of transistors that the temperature of any process after the diffusion treatment does not exceed 900° C.

FIG. 8 shows the influence of the thickness of second pyrolytic silicon oxide film formed in the step of FIG. 2*g* on the surface of the N-type silicon substrate having a resistivity of about 25 to 40 Ω·cm. in terms of the equivalent number of electrons $N_{FB}$ induced in the silicon interface of unit area, corresponding to the flat-band voltage. In this case, in more detail the first pyrolitic silicon oxide film of about 3,300 A. thickness is formed on the surface of substrate by the pyrolytic reaction of organic silane. A glass layer containing silicon oxide and phosphorus oxide of about 400 A. is formed at no higher than 850° C. on the first film. Further, the second pyrolytic silicon oxide films of various thickness as shown in the abscissa in FIG. 8 is formed on the surface of the glass layer. The curve 61 shows that $N_{FB}$ is extremely small in the range between 2,000 A. and 6,000 A. thicknesses. Therefore, the deposition of the second film of this range protects the phosphorus oxide layer having a poor moisture property rather than promote the formation of the donor level.

In the above-mentioned method of this invention, the movement of the PN-junction does not appear essentially in the semiconductor substrate. The silicon oxide film formed at a relatively low temperature does not exert much distortion on the semiconductor substrate.

Thus, the thermally grown silicon oxide film which is employed as a mask for the selective diffusion treatment is renewed by a clean silicon oxide film by depositing it at a low temperature after the diffusion treatment. The deposited film is used as a surface passivation film so that the electrical characteristics are improved.

Etching done prior to the formation of the clean silicon oxide film is effective in the improvement of the electrical characteristics such as the current amplification factor and the noise characteristics. The thermally grown silicon oxide film used as a mask for the selective diffusion treatment causes unfavorable regions such as crystal defects in the surface of semiconductor substrate. The removal of such defects by etching and the formation of the clean silicon oxide on the pure surface serves to eliminate the bad influences due to the high temperature and the diffusion treatments.

Further, according to another embodiment of this invention in order to form the insulating layer containing phosphorus oxide on the semiconductor substrate the following three methods other than the above method as detailed in FIGS. 2*a* and 2*f* may be available. These methods can also assure a semiconductor device having an excellent waterproof property.

i. After a pyrolytic silicon oxide film having a thickness larger than 3,000 A. is formed on a silicon substrate, a thin phosphorus oxide layer of about 200 A. thickness is formed on the silicon oxide film by the pyrolytic decomposition of $POCl_3$ and $PH_3$ in the oxidizing atmosphere at about 300° C. In this case phosphorus oxide is entirely combined with silicon oxide thereby to form a mixture or glass consisting of silicon oxide and phosphorus oxide.

ii. After a pyrolytic silicon oxide film having a prescribed thickness is formed on the silicon substrate, the substrate is heated at about 740° C. Tetraethoxysilane and $POCl_3$ gas are simultaneously introduced with $O_2$ gas as the carrier gas, thereby directly forming on the silicon oxide film a mixed layer or a glass layer of 200 to 1,000 A. thickness consisting of silicon oxide and phosphorus oxide.

iii. A silicon substrate having a cleaned exposed surface is prepared. A pyrolytic oxide film having a thickness of at least 3,000 to 5,000 A. is formed on the exposed surface. The substrate is heated at about 740° C. in a reaction tube. $POCl_3$ gas and tetraethoxysilane gas are simultaneously introduced into the reaction tube with $O_2$ gas as the carrier gas. Thus, a layer consisting of silicon oxide and phosphorus oxide is directly formed on the surface of silicon substrate.

According to a further embodiment of this invention, the remaining layer rich in phosphorus oxide may be removed as shown in FIG. 3 (where like parts are denoted by like reference numerals as in FIG. 2*f*.)

According to still another embodiment of this invention, a desired transistor can be obtained by the following steps (g') (h') (i') after the step (f). Explanation will be made next with reference to FIGS. 4*a* and 4*b* where like reference numerals are used to denote like parts as in FIG. 2*f*.

g'. An aluminum (Al) layer 9*a* is coated on the glass film 7 containing silicon oxide and phosphorus oxide (the surface contains a layer having a prescribed thickness and rich in phosphorus oxide), as shown in FIG. 4*a*.

The semiconductor substrate 1 is disposed under a low pressure between $10^{12}$ and $10^{15}$ mm. Hg and aluminum is deposited 500 A. from a position 25 cm. above the substrate.

h'. The substrate is heated for 30 minutes at a temperature no higher than 900° C., e.g. 740° C., in the oxidizing atmosphere. As a result, the whole or a part of the unwanted layer rich in phosphorus oxide is converted to a glass film 9*b* composed of a mixture of alumina-phosphorus oxide-silicon oxide as shown in FIG. 4*b*. This state is made more apparent when a comparison is made between the curves 11 and 12 in FIG. 1 which are obtained in another embodiment. The layer rich in phosphorus oxide (corresponding to the part *a*) is converted to a layer (corresponding to the parts *d*, *e* and *f*) which is inferred to contain alumina, phosphorus oxide and silicon oxide. The parts *b* and *g* correspond to each other.

i'. For the same purpose and by the same method as in the first embodiment a pyrolytic silicon oxide film 10 is formed 1,500 A. thick on the glass film 9*b* as shown in FIG. 4*c*.

The formation of the layer containing alumina and phosphorus oxide can be obtained by making a pyrolytic reaction of an organic aluminum compound e.g. triethoxyaluminum at about 300 to 500° C. to form an alumina layer and thereafter making a reaction between the alumina layer and the layer rich in phosphorus oxide.

Next, aluminum electrodes are fitted to the base 3 and the emitter 4 by a well-known method. External leads are connected to these electrodes and the semiconductor substrate 1 or the collector. By embedding the device in epoxyresin a so-called resin mold transistor is obtained.

The transistors thus fabricated were subjected to the waterproof test as previously mentioned. FIG. 6 shows the result. Curves 41, 42, 43 and 44 show the percentage of inferior ones after the heating and cooling treatments of each 100 good transistors which were obtained by being passed through the steps (a) to (d), deposited with the phosphorus oxide layer 6 with different thickness, heated for 40 minutes in the step (f) to have the glass layer rich in phosphorus oxide of 200 A., 400 A., 600 A. or 1,000 A., and finally passed through the steps (g') to (i'.)

It is seen in the FIG. 6 that the characteristics of the transistors against the environment test depends on the thickness of the glass film containing phosphorus oxide formed on the silicon oxide film, particularly the region rich in phosphorus oxide. When the thickness is less than 600 A., particularly less than 200 A., the waterproof property becomes extremely good.

The formation of the oxide film at a low temperature can be done by the pyrolytic reaction of other organoxysilanes such as propoxysilane and methoxypilane. With monosilane it can be done at about 320° C.

The above explanation has given only a few examples of this invention. Various modifications may be made by those skilled in the art without departing from the scope of this invention.

What is claimed is:

1. A method for manufacturing a semiconductor device with a passivation film comprising the steps of preparing a semiconductor substrate having a major surface;

depositing silicon oxide on said major surface at a temperature no higher than 900° C. thereby to form a silicon oxide film, and forming on the surface of said deposited silicon oxide film a mixed layer containing phosphorus oxide and silicon oxide at a temperature no higher than about 900° C.

2. A method for manufacturing a semiconductor device with a passivation film according to claim 1, wherein the formation of said mixed layer is attained by depositing on the surface layer of said deposited silicon oxide film phosphorus oxide from its vapor phase at a temperature no higher than 900° C. and thereafter making a reaction between said surface layer and the deposited phosphorus oxide at a temperature no higher than 900° C.

3. A method for manufacturing a semiconductor device with a passivation film according to claim 1, wherein the formation of said mixed layer is attained by depositing simultaneously silicon oxide and phosphorus oxide on the surface of said deposited silicon oxide film.

4. A method for manufacturing a semiconductor device with a passivation film according to claim 1, comprising a further step of depositing silicon oxide on the surface of said mixed layer at a temperature no higher than about 900° C. thereby to form a second silicon oxide film with a thickness of about 2,000 to 6,000 A.

5. A method for manufacturing a semiconductor with having a passivation film comprising the steps of depositing on a major surface of a semiconductor substrate silicon oxide from vapor phase at a temperature no higher than about 900° C. thereby to form a silicon oxide film;

depositing on the surface layer of said silicon oxide film phosphorus oxide from an oxidizing atmosphere containing phosphorus at no higher than about 900° C.; and making a reaction between said deposited phosphorus oxide and said surface layer at a temperature no higher than 900° C. for a prescribed time thereby to form in the surface layer of said silicon oxide film a mixed layer of phosphorus oxide and silicon oxide such that a surface layer rich in phosphorus oxide and having a thickness of no more than about 400 A. is formed in the surface of said mixed layer.

6. A method for manufacturing a semiconductor with having a passivation film according to claim 5 comprising a further step of making a reaction between said surface layer rich in phosphorus oxide and alumina thereby to form a layer containing alumina and phosphorus oxide.

7. A method for manufacturing a semiconductor with having a passivation film according to claim 6 comprising a further step of depositing silicon oxide on the surface of said layer containing alumina and phosphorus oxide at a temperature no higher than about 900° C. thereby to form a layer containing alumina, silicon oxide and phosphorus oxide.

8. A method for manufacturing a semiconductor with having a passivation film according to claim 5 comprising a further step of depositing silicon oxide on the surface layer rich in the phosphorus oxide at a temperature no higher than about 900° C. thereby to form a second silicon oxide film.

9. A method for manufacturing a semiconductor device with a passivation film according to claim 4 comprising further a step of removing said surface layer rich in phosphorus oxide.

10. A method for manufacturing a semiconductor device with a passivation film comprising the steps of preparing a silicon semiconductor substrate of one conductivity-type having a major surface;

forming on said major surface a first oxide film by the thermal growth method selectively;

introducing selectively an impurity determining the second conductivity-type in said major surface with said oxide film as a mask thereby to form a region of second conductivity type in said major surface and obtain a PN-junction between said substrate and said region of second conductivity-type such that the PN-junction terminates in said major surface of said substrate;

removing said first oxide film entirely thereby to expose said major surface;

forming on said exposed major surface a second oxide film by the pyrolytic reaction of silicon compounds so as to cover said PN-junction depositing phosphorus oxide on the surface of said second oxide film from an oxydizing atmosphere containing phosphorus at a temperature no higher than 900° C.; and making a reaction between said deposited phosphorus oxide and the surface layer of said second silicon oxide thereunder at a temperature no higher than 900° C. thereby to form a mixed layer of phosphorus oxide and silicon oxide in said surface layer in such a manner as to form a surface layer rich in phosphorus oxide and having a thickness no more than about 400 A. in the surface of said mixed layer.

11. A method for manufacturing a semiconductor device with a passivation film according to claim 10 comprising further a step of lightly etching away no more than about 1 μ thick the surface of said substrate prior to the formation of said second oxide film.

12. A method for manufacturing a semiconductor device with a passivation film according to claim 10 comprising further a step of depositing silicon oxide on the surface layer rich in phosphorus oxide at a temperature no higher than about 900° C. thereby to form a second silicon oxide film of about 2,000 to 6,000 A. thickness.

UNITED STATES PATENT OFFICE

CERTIFICATE OF CORRECTION

Patent No. 3,615,941 Dated October 26, 1971

Inventor(s) Eiichi Yamada and Masayuki Yamamoto

It is certified that error appears in the above-identified patent and that said Letters Patent are hereby corrected as shown below:

Title Page, left column, line 7, which now reads:

"Assignee Hatachi, Ltd.

should read as follows:

-- Assignee Hitachi, Ltd. --

Signed and sealed this 30th day of May 1972.

(SEAL)
Attest:

EDWARD M.FLETCHER,JR.
Attesting Officer

ROBERT GOTTSCHALK
Commissioner of Patents